United States Patent
Embar et al.

(10) Patent No.: US 9,628,027 B2
(45) Date of Patent: Apr. 18, 2017

(54) MULTI-PATH DEVICES WITH MUTUAL INDUCTANCE COMPENSATION NETWORKS AND METHODS THEREOF

(71) Applicant: Freescale Semiconductor, Inc., Austin, TX (US)

(72) Inventors: Ramanujam Srinidhi Embar, Gilbert, AZ (US); Damon G. Holmes, Scottsdale, AZ (US); Joseph Staudinger, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 164 days.

(21) Appl. No.: 14/211,410

(22) Filed: Mar. 14, 2014

(65) Prior Publication Data

US 2015/0263681 A1  Sep. 17, 2015

(51) Int. Cl.
  *H03H 7/38* (2006.01)
  *H03F 1/02* (2006.01)
  (Continued)

(52) U.S. Cl.
  CPC ......... *H03F 1/0288* (2013.01); *H03F 1/0294* (2013.01); *H03F 3/195* (2013.01);
  (Continued)

(58) Field of Classification Search
  CPC ...... H03F 1/0288; H03F 1/0294; H03F 3/195; H03F 3/245; H03F 3/68; H03F 2200/451;
  (Continued)

(56) References Cited

U.S. PATENT DOCUMENTS 4,379,341 A * 4/1983 Toyooka .............. G11C 19/085
  365/6
4,686,492 A  8/1987 Grellmann et al.
(Continued)

FOREIGN PATENT DOCUMENTS

WO  2004088837 A2  10/2004

OTHER PUBLICATIONS

Peng et al., "A Highly Efficient Interleaved DC-DC Converter using Coupled Inductors in GaAs Technology", IEEE Circuits and Systems, 2009, pp. 1105-1108.
(Continued)

*Primary Examiner* — Robert Pascal
*Assistant Examiner* — Kimberly Glenn (57) ABSTRACT

The embodiments described herein provide compensation for mutual inductance in a multi-path device. In one embodiment, a device includes a multi-path integrated device. The multi-path integrated device includes a first output and a second output. The first output is configured to be coupled to a first output lead through a first bonding wire, and the second output is configured to be coupled to a second output lead through a second bonding wire. Due to their proximity, the second bonding wire has a first mutual inductance with the first bonding wire. A first compensation network is coupled to the first output, and a second compensation network is coupled to the second output. The second compensation network is configured to have a second mutual inductance with the first compensation network. The second mutual inductance at least partially cancels the effects of the first mutual inductance.

20 Claims, 4 Drawing Sheets

(51) Int. Cl.
    *H03F 3/195* (2006.01)
    *H03F 3/24* (2006.01)
    *H03F 3/68* (2006.01)

(52) U.S. Cl.
    CPC .............. *H03F 3/245* (2013.01); *H03F 3/68* (2013.01); *H03F 2200/451* (2013.01); *H03F 2200/537* (2013.01); *H03F 2200/541* (2013.01); *Y10T 29/41* (2015.01)

(58) Field of Classification Search
    CPC ......... H03F 2200/537; H03F 2200/541; H03F 1/191; H03F 3/19; Y10T 29/41
    USPC .......................................... 333/124; 330/302
    See application file for complete search history.

(56) References Cited

U.S. PATENT DOCUMENTS

| | | | |
|---|---|---|---|
| 4,894,619 A * | 1/1990 | Leinonen | G01V 3/104 324/239 |
| 5,004,317 A | 4/1991 | Jackson et al. | |
| 7,061,329 B2 | 6/2006 | Inoue et al. | |
| 7,106,070 B2 * | 9/2006 | Bertness | G01R 31/3627 324/538 |
| 7,262,656 B2 | 8/2007 | Shiikuma | |
| 7,295,074 B2 | 11/2007 | Wong et al. | |
| 7,362,170 B2 | 4/2008 | Louis | |
| 7,874,878 B2 * | 1/2011 | Fite | H01R 13/6658 439/620.21 |
| 8,030,763 B2 | 10/2011 | Romero et al. | |
| 8,110,932 B2 * | 2/2012 | Sjoestroem | H01L 23/66 257/531 |
| 8,659,359 B2 | 2/2014 | Ladhani et al. | |
| 2005/0087856 A1 | 4/2005 | Joiner et al. | |
| 2007/0235855 A1 | 10/2007 | Bokatius et al. | |
| 2011/0298535 A1 | 12/2011 | Van Rijs et al. | |
| 2012/0313707 A1 | 12/2012 | Heid | |
| 2014/0070365 A1 | 3/2014 | Viswanathan et al. | |
| 2014/0167855 A1 | 6/2014 | Ladhani et al. | |
| 2014/0167863 A1 | 6/2014 | Ladhani et al. | |

OTHER PUBLICATIONS

Dal Fabbro, P.A. et a., "RF Power Amplifier Employing a Frequency-Tunable Impedance Matching Network Based on Coupled Inductors"; IEEE Electronics Letters, vol. 44, issue 19; Sep. 11, 2008, pp. 1131-1132.

Doherty, W.H.; "A New High-Efficiency Power Amplifier for Modulated Waves"; Proceedings of Annual Convention of the Institute of Radio Engineers; May 11-13, 1936; pp. 469-474.

U.S. Appl. No. 14/573,927, filed Dec. 17, 2014, entitled "Magnetically Coupled Load Modulation".

Notice of Allowance mailed Jun. 20, 2011 for U.S. Appl. No. 12/147,313, 10 pages.

* cited by examiner

MULTI-PATH DEVICES WITH MUTUAL INDUCTANCE COMPENSATION NETWORKS AND METHODS THEREOF

TECHNICAL FIELD

Embodiments of the subject matter described herein relate generally to electronic devices, and more particularly to multi-path devices used in radio frequency (RF) semiconductor applications.

BACKGROUND

Radio frequency systems commonly employ dual-path devices as building blocks for various tasks such as signal routing, combining and monitoring. Examples of dual-path devices include dual-path amplifiers, such as balanced or Doherty amplifiers.

One issue with such dual-path devices is close physical proximity of adjacent elements. For example, in some dual-path amplifiers the wire bonds for the two inputs of the two paths can have close physical proximity. Likewise, the wire bonds for the two outputs of the dual-path amplifier can have close physical proximity. In any of such cases, the close physical proximity of the adjacent wire bonds can induce magnetic coupling between the adjacent wire bonds. Such induced magnetic coupling can degrade the performance of the dual-path amplifier. For example, the induced magnetic coupling can displace the impedance at the inputs of the device, and thus limit the RF performance.

As one specific example, the magnetic coupling between wire bonds can shift the impedance in a way that is dependent upon the phase difference between signals carried on the two paths in the dual-path device. Such a phase difference can further result in a gain variation along one path that is dependent upon the phase difference, and thus can cause RF performance degradation.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The embodiments described herein can provide semiconductor devices with improved performance. Embodiments include dual-path devices that are typically used in radio frequency (RF) applications. Specific examples include multi-path amplifiers (e.g., amplifiers that include two, three, or more parallel amplification paths), such as Doherty and balanced power amplifiers. In general, Doherty and balanced power amplifiers are amplifiers that use multiple amplifying devices (e.g., transistors) that are run in quadrature (i.e., 90 degrees apart in phase). In balanced power amplifiers, a hybrid coupler (or other signal splitting/phase shifting circuitry) is used to generate two phase-shifted signals that are 90 degrees out of phase, and these two signals are then amplified separately and combined again with a second coupler (or other combiner circuitry). Such dual-path amplifiers provide a variety of useful features, such as reduced reflection and increased immunity to load pull effects.

In general, the embodiments described herein provide improved isolation between elements in the multiple paths of a multi-path device (e.g., between the wire bonds at the inputs and/or outputs of dual-path amplifiers). As such, these embodiments can improve the performance of such multi-path devices and the RF systems that utilize these devices. Although the majority of the description herein and the associated figures describe and depict implementation of the various embodiments in a dual-path device, those of skill in the art would understand, based on the description herein, how to apply the embodiments in systems and devices that include more than two parallel amplification paths (e.g., a Doherty amplifier with a main amplification path and two peaking paths, or another multi-path amplifier).

In one embodiment, a device includes a dual-path integrated device, the dual-path integrated device having a first output and a second output. The first output is configured to be coupled to a first output lead through a first set of one or multiple parallel bonding wires (referred to herein as a "first bonding wire" and depicted in the figures with a single bonding wire for simplicity) and the second output is configured to be coupled to a second output lead through a second set of one or multiple parallel bonding wires (referred to herein as a "second bonding wire" and depicted in the figures with a single bonding wire for simplicity). Because of their proximity the second bonding wire has a first mutual inductance with the first bonding wire. In accordance with the embodiments described herein, a first compensation network is coupled to the first output, and a second compensation network is coupled to the second output. The second compensation network is configured to have a second mutual inductance with the first compensation network, and this second mutual inductance is configured to at least partially cancel effects of the first mutual inductance. This partial cancellation of the effects of the first mutual inductance can improve the performance of the dual-path device. For example, this cancellation can improve the performance of the dual-path amplifiers by reducing the load impedance variations. Such a reduction in load impedance variations can improve the performance of the dual-path amplifiers by improving amplifier performance parameters such as gain, DC-to-RF power conversion efficiency and peak output power capability that can otherwise be caused by the first mutual inductance. This is especially true for high power amplifiers where the performance (e.g., gain, efficiency, power capability) is highly dependent on the effective load impedance.

Figure 1:
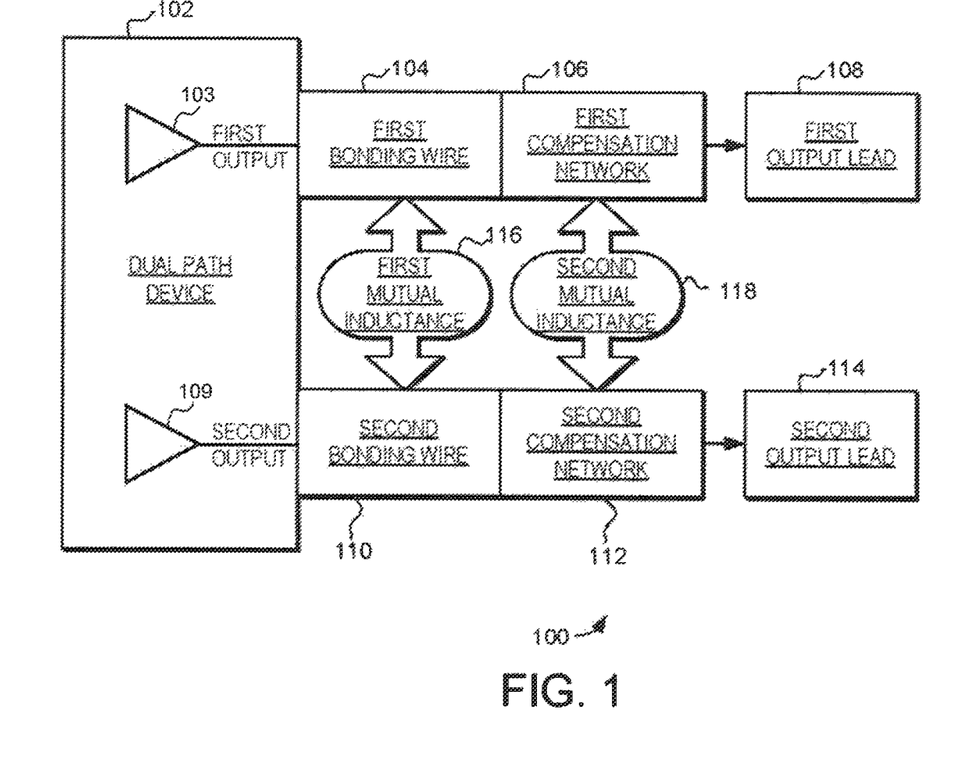
FIG. 1 is a schematic diagram of a semiconductor device in accordance with an example embodiment.

FIG. 1 illustrates a schematic view of a device 100. The device 100 includes an integrated dual-path device 102, a first bonding wire 104, a first compensation network 106, a first output lead 108, a second bonding wire 110, a second compensation network 112 and a second output lead 114. A first mutual inductance 116 exists between the first bonding wire 104 and the second bonding wire 110, and a second mutual inductance 118 is formed between the first compensation network 106 and the second compensation network 112. As will be described in greater detail below, the first compensation network 106 and the second compensation network 112 are configured such that the second mutual inductance 118 at least partially cancels the effects of the first mutual inductance 116.

In general, the dual-path device 102 can comprise any type of integrated dual-path device. For purposes of this disclosure, a dual-path device 102 comprises any device with at least two independent signal paths between respective input and output terminals and with at least two semiconductor devices (e.g., transistors) in those independent signal paths. The two semiconductor devices forming the dual-path device 102 may be fabricated on the same semiconductor substrate or on different substrates. Furthermore, each path may include a multiplicity of unit cell transistors combined in parallel using common industry standard multifinger/interdigitated layout techniques. As one specific example the dual-path device 102 can comprise a dual-path amplifier (e.g., dual-path amplifiers 103, 109, where two RF signals are amplified independently and in some cases subsequently combined into a single load). Examples of dual-path amplifiers include both Doherty and balanced power amplifiers.

In a typical implementation, the dual-path device 102 is formed on a semiconductor wafer that is then split into multiple semiconductor dies for packaging. Each die may include multiple integrated devices and multiple contact pads configured for connecting the devices on the die to leads on the package (e.g. first output lead 108 and second output lead 114). The connections between pads on the die and the leads on the package are made with bonding wires (e.g., first bonding wire 104 and second bonding wire 110). For purposes of this disclosure, the leads 108, 114 can comprise any suitable type of semiconductor package leads, including pin leads, flat leads, and others. Also, for purposes of this disclosure, the bonding wires 104, 110 can comprise any suitable type of wire connection between semiconductor dies and package leads. As such, the bonding wires 104, 110 can comprise high conductivity metal filament. It should also be noted that in some embodiments the first bonding wire 104 and second bonding wire 110 could each comprise a wire array (i.e., a plurality of parallel bonding wires).

In the device 100 the dual-path device 102 includes a first output and a second output. For example, the first output and the second output can correspond to the two outputs of a dual-path amplifier (e.g., outputs of a main amplifier 103 and a peaking amplifier 109 of a Doherty amplifier). The first output of the dual-path device 102 is configured to be coupled to the first output lead 108 through the first bonding wire 104. Likewise, the second output of the dual-path device 102 is configured to be coupled to the second output lead 114 through the second bonding wire 110.

Due to the proximity between bonding wires 104, 110, there can be a significant magnetic coupling. Specifically, significant magnetic coupling can exist between the bonding wires associated with the two outputs of the dual-path device, i.e., first bonding wire 104 and second bonding wire 110. This magnetic coupling generates a mutual inductance between the bonding wires 104 and 110, represented in FIG. 1 as first mutual inductance 116. Specifically, this first mutual inductance 116 is generated by the magnetic field components from the first bonding wire 104 piercing the surface area formed by the second bonding wire 110 and a ground conductor (e.g., a flange, not illustrated, to which the dual-path device 102 is attached) located beneath the second bonding wire 110. The first mutual inductance 116 displaces the impedance at the output of the dual-path device 102 and can negatively impact the performance of the dual-path device 102. This is particularly true in dual-path amplifiers where the mutual inductance can cause a frequency dependent change in the gain of the two paths in the amplifier.

In accordance with the embodiments described herein, the first compensation network 106 is coupled to the first output of the dual-path device 102, and the second compensation network 112 is coupled to the second output of the dual-path device 102. The second compensation network 112 is configured to have a second mutual inductance 118 with the first compensation network 106, and this second mutual inductance 118 is configured to at least partially cancel effects of the first mutual inductance 116. Furthermore, the first compensation network 106 is formed in series with the first bonding wire 104 and the first output lead 108, and the second compensation network 112 is formed in series with the second bonding wire 110 and the second output lead 114. Thus, current flowing in the first bonding wire 104 also flows in the first compensation network 106, and current flowing in the second bonding wire 110 also flows in the second compensation network 112. The formation of the second mutual inductance 118 can be accomplished by forming the first compensation network 106 in close proximity with the second compensation network 112. Again, because of the close proximity of the first compensation network 106 and the second compensation network 112, there can be significant magnetic coupling. Thus, properly configured, the magnetic coupling between first compensation network 106 and the second compensation network 112 will generate the second mutual inductance 118 in such a way that the second mutual inductance 118 will at least partially cancel the first mutual inductance 116.

To generate the second mutual inductance 118 in such a way that it at least partially cancels the first mutual inductance 116, the first compensation network 106 and the second compensation network 112 are configured with "negative" magnetic coupling relative to the "positive" magnetic coupling of the bonding wires 104 and 110. Stated another way, the first compensation network 106 and the second compensation network 112 are configured with "negative" mutual inductance relative to the "positive" mutual inductance of the bonding wires 104 and 110. Of course the directions of "positive" and "negative" in these contexts are arbitrary as long as the two directions of the magnetic coupling are substantially opposite. Stated another way, current flowing in one bonding wire induces a current in the other bonding wire in a first direction (or first polarity), and that same current flowing in the compensation network will induce a current in the other compensation network in an opposite second direction (or opposite second polarity) compared to the first direction.

To provide such a "negative" mutual coupling, the first compensation network 106 and the second compensation network 112 can be implemented as interleaved conductors wherein adjacent conductors carry current in the opposite direction compared to the current flowing in the adjacent bonding wires 104 and 110. As one example, the relative coiling direction of the compensation networks 106 and 112 can be made opposite to the relative coiling direction of the bonding wires 104 and 106.

Furthermore, it will generally be desirable for the magnitude of the magnetic coupling between the compensation networks 106 and 112 to be substantially equal to the magnitude of the magnetic coupling between the bonding wires 104 and 110. This allows the negative magnetic coupling to most effectively cancel the positive negative coupling.

In one embodiment, the first compensation network 106 and the second compensation network 112 are implemented with bonding wires having a relative coiling direction opposite the coiling direction of the first bonding wire 104 and the second bonding wire 110. In a second embodiment the first compensation network 106 and the second compensation network 112 are implemented with interleaved integrated passive inductors. Such integrated passive inductors can be formed on the same semiconductor die as the dual-path device 102, or they may be formed on separate semiconductor die from the dual-path device 102.

In the embodiment illustrated in FIG. 1, the first compensation network 106 is implemented between the first bonding wire 104 and the first output lead 108. Likewise, the second compensation network 112 is between the second bonding wire 110 and the second output lead 114. Such an embodiment can be implemented with the compensation networks 106 and 112 formed with bonding wires.

However, this is just one example. In other embodiments, the compensation networks 106 and 112 can be implemented on the dual-path device 102 or between the dual-path device 102 and the bonding wires 104 and 110. For example, the compensation networks 106 and 112 can be formed with bonding wires and implemented between the first bonding wire 104 and the dual-path device 102 and the second bonding wire 110 and the dual-path device 102. As another example, the compensation networks 106 and 112 can be implemented with integrated passive inductors formed on the semiconductor die with the dual-path device 102. Again, such integrated passive inductors may be interleaved to provide negative magnetic inductance compared to the magnetic inductance between the first bonding wire 104 and the second bonding wire 110.

As previously described, the at least partial cancellation of the effects of the first mutual inductance 116 can improve the performance of the dual-path device 102. For example, this cancellation can improve the performance of the dual-path amplifiers by reducing the load impedance variation that can otherwise be caused by the first mutual inductance 116.

Figure 2:
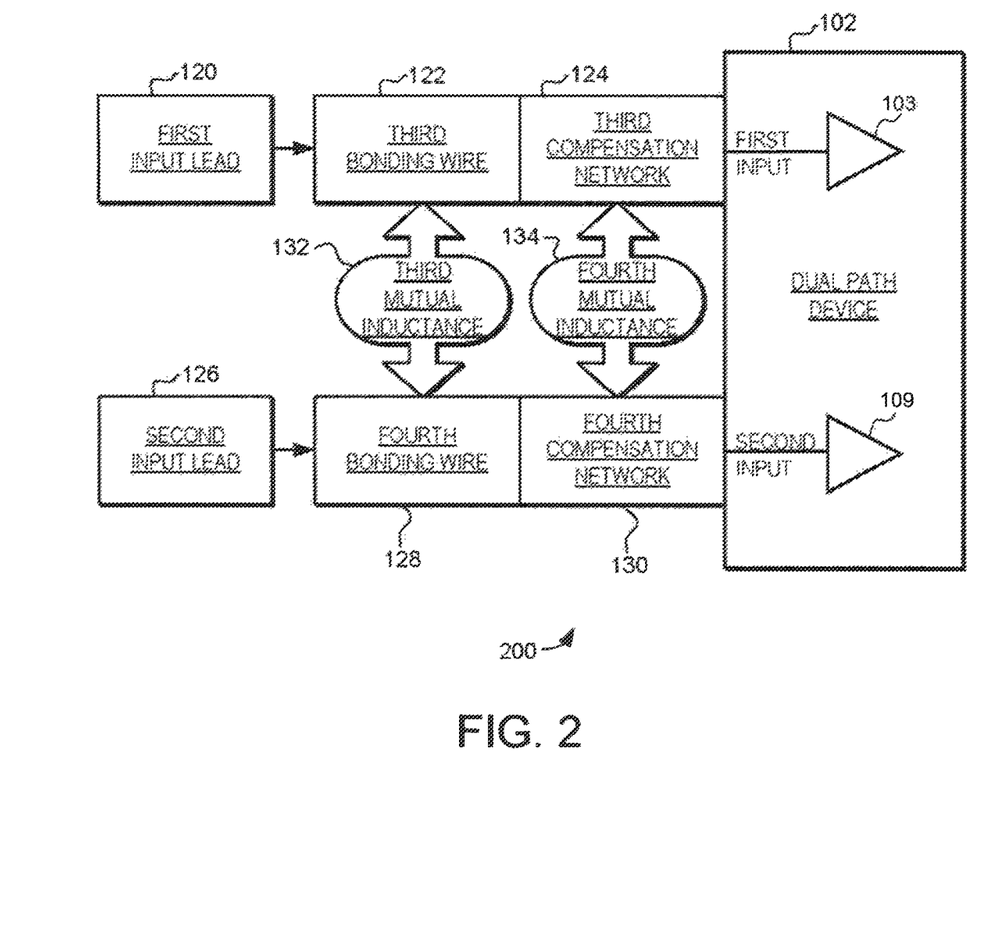
FIG. 2 is a schematic diagram of a semiconductor device in accordance with an example embodiment.

In the embodiment illustrated in FIG. 1, the compensation networks 106 and 112 are applied to the outputs of the dual-path device 102. Thus, the compensation networks 106 and 112 provide at least a partial cancellation of mutual inductance at the output of the dual-path device 102. In other embodiments, similar techniques can be applied to the inputs of the dual-path device 102. FIG. 2 illustrates a schematic view of a device 200. The device 200 includes an integrated dual-path device 102, a first input lead 120, a third bonding wire 122, a third compensation network 124, a second input lead 126, a fourth bonding wire 128, and a fourth compensation network 130. A third mutual inductance 132 exists between the third bonding wire 122 and the fourth bonding wire 128, and a fourth mutual inductance 134 is formed between the third compensation network 124 and the fourth compensation network 130. Similar to the first embodiment depicted and described in conjunction with FIG. 1, the third compensation network 124 and the fourth compensation network 130 are configured such that the fourth mutual inductance 134 at least partially cancels the effects of the third mutual inductance 132.

In the device 200, the dual-path device 102 includes a first input and a second input. For example, the first input and the second input can correspond to the two inputs of a dual-path amplifier (e.g., inputs to a main amplifier 103 and a peaking amplifier 109 of a Doherty amplifier). The first input of the dual-path device 102 is configured to be coupled to the first input lead 120 through the third bonding wire 122. Likewise, the second input of the dual-path device 102 is configured to be coupled to the second input lead 126 through the fourth bonding wire 128.

Again, because of the proximity between bonding wires 122, 128 there can be significant magnetic coupling. Specifically, significant magnetic coupling can exist between the bonding wires associated with the two inputs of the dual-path device, i.e., third bonding wire 122 and fourth bonding wire 128. This magnetic coupling generates a mutual inductance between the bonding wires 122 and 128, represented in FIG. 2 as third mutual inductance 132. The third mutual inductance 132 displaces the impedance at the input to the dual-path device 102, and can negatively impact the performance of the dual-path device 102. This is particularly true in dual-path amplifiers where the mutual inductance can cause a frequency dependent change in the gain of the two paths in the amplifier.

In the embodiment of FIG. 2, the third compensation network 124 is coupled to the first input and the fourth compensation network 130 is coupled to the second input. The fourth compensation network 130 is configured to have a fourth mutual inductance 134 with the third compensation network 124 and this fourth mutual inductance 134 is configured to at least partially cancel effects of the third mutual inductance 132. Such a fourth mutual inductance 134 can be implemented using all the techniques described above for the second mutual inductance 118 (FIG. 1). When properly configured, the fourth mutual inductance 134 can at least partially cancel the third mutual inductance 132.

In the embodiment illustrated in FIG. 2, the third compensation network 124 is implemented between the third bonding wire 122 and the first input. Likewise, the fourth compensation network 130 is between the fourth bonding wire 128 and the second input. However, this is just one example and the compensation networks 124 and 130 can be implemented in other positions relative to the bonding wires 122 and 128 and the input leads 120 and 126. For example, in other embodiments the compensation networks 124 and 130 can be implemented with the dual-path device 102. For example, using integrated passive inductors the compensation networks 124 and 130 can be formed on a same semiconductor die as dual-path device 102. Alternatively, the integrated passive inductors may be formed on one or more different semiconductor die from the dual-path device 102 In other embodiments the compensation networks 124 and 130 can be implemented between the bonding wires 122, 128 and the input leads 120, 126 (e.g., using additional bonding wires to implement the compensation networks 124 and 130).

Figure 3:
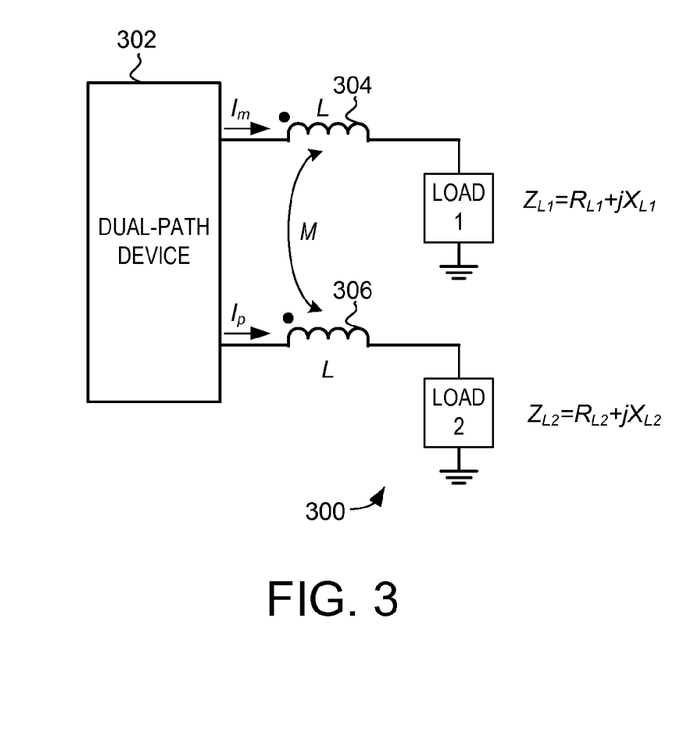
FIG. 3 is a circuit diagram of a semiconductor device.

FIG. 3 illustrates a circuit 300 that includes a dual-path device 302 with two outputs. The two outputs of dual-path device 302 are coupled to two loads, illustrated as LOAD 1 and LOAD 2. In this case, the inductances of the bonding wires used to couple the dual-path device 302 to output leads are represented as inductors 304 and 306, each having an inductance L. And as described above, there exists a mutual inductance between bonding wires, in this case illustrated as a mutual inductance M.

Assuming that LOAD 1 has an impedance $Z_{L1}=R_{L1}+jX_{L1}$ and LOAD 2 has an impedance $Z_{L2}=R_{L2}+jX_{L2}$, and assuming that the upper output provides a current $I_m$ and the lower output provides a current $I_p$, the actual loads $\bar{Z}_m$ and $\bar{Z}_p$ seen by the outputs of the dual-path device 302 will be:

$$\bar{Z}_m = j\omega L + \bar{Z}_{L1} + j\omega M \frac{\bar{I}_p}{\bar{I}_m}$$ (Equation 1)

$$\bar{Z}_p = j\omega L + \bar{Z}_{L2} + j\omega M \frac{\bar{I}_m}{\bar{I}_p}$$

As can be seen in Equation 1, the actual loads $\bar{Z}_m$ and $\bar{Z}_p$ seen by the outputs of the dual-path device 302 vary with the operating frequency, w, of the dual-path device 302 and the relative currents through the loads. As described above, such a variation in load impedance can negatively impact the gain, DC-to-RF power conversion efficiency, and output power capability performance of the dual-path device 302.

Figure 4:
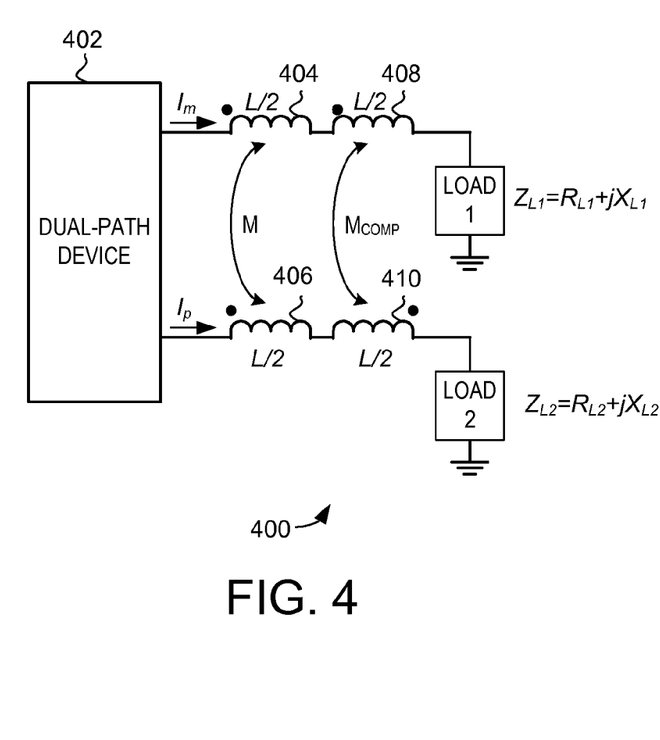
FIG. 4 is a circuit diagram of a semiconductor device with compensation in accordance with an example embodiment.

FIG. 4 illustrates a circuit 400 that includes a dual-path device 402 with two outputs. Again, the two outputs of dual-path device 402 are coupled to two loads, illustrated as LOAD 1 and LOAD 2. In this case, the inductances of the bonding wires used to couple dual-path device 402 to the output leads are represented as inductors 404 and 406 each having an inductance L/2. As described above, there exists a mutual inductance between bonding wires, illustrated in this case as a mutual inductance M. Furthermore, in accordance with the embodiments described above, a first compensation network and a second compensation network are provided. In this case, the first compensation network and the second compensation network are represented as inductors 408 and 410 each having an inductance L/2. Also in this case, the inductors 408 and 410 have a mutual inductance $M_{COMP}$, which is negative compared to the mutual inductance M between the bonding wires. In this case, the direction of the negative mutual inductance is illustrated by the dot convention, where the dots on the inductors indicate that current entering one dot induces a current to enter the other dot. As illustrated the mutual inductance $M_{COMP}$ will induce a current in the opposite direction compared to the mutual inductance M, and thus will tend to cancel the effects of the mutual inductance M. It should also be noted that in this case the inductance of the bond wires and the compensation networks are each L/2 and thus provide the same overall inductance provided in the example of FIG. 3.

Assuming that LOAD 1 has an impedance $Z_{L1}=R_{L1}+jX_{L1}$ and LOAD 2 has an impedance $Z_{L2}=R_{L2}+jX_{L2}$, and assuming that the upper output provides a current $I_m$ and the lower output provides a current $I_p$, the actual loads $\bar{Z}_m$ and $\bar{Z}_p$ seen by the outputs of the dual-path device 402 will be:

$$\bar{Z}_m = j\omega\left(\frac{L}{2}+\frac{L}{2}\right) + \bar{Z}_{L1} + j\omega M \frac{\bar{I}_p}{\bar{I}_m} - j\omega M_{COMP} \frac{\bar{I}_p}{\bar{I}_m}$$ (Equation 2)

$$\bar{Z}_p = j\omega\left(\frac{L}{2}+\frac{L}{2}\right) + \bar{Z}_{L2} + j\omega M \frac{\bar{I}_m}{\bar{I}_p} - j\omega M_{COMP} \frac{\bar{I}_m}{\bar{I}_p}$$

As can be seen in Equation 2, when the magnitude of mutual inductance M is equal to the magnitude of the compensation mutual inductance $M_{COMP}$, the effects of the mutual inductances will cancel and the resulting $\bar{Z}_m$ and $\bar{Z}_p$ will be:

$$\bar{Z}_m = j\omega(L/2+L/2) + \bar{Z}_{L1}$$

$$\bar{Z}_p = j\omega(L/2+L/2) + \bar{Z}_{L2}$$ (Equation 3)

Thus, the frequency dependent effects are cancelled and the frequency dependent variation in amplifier performance that would otherwise result from variations in the load impedance is reduced when compared with the device 300 of FIG. 3.

Figure 5:
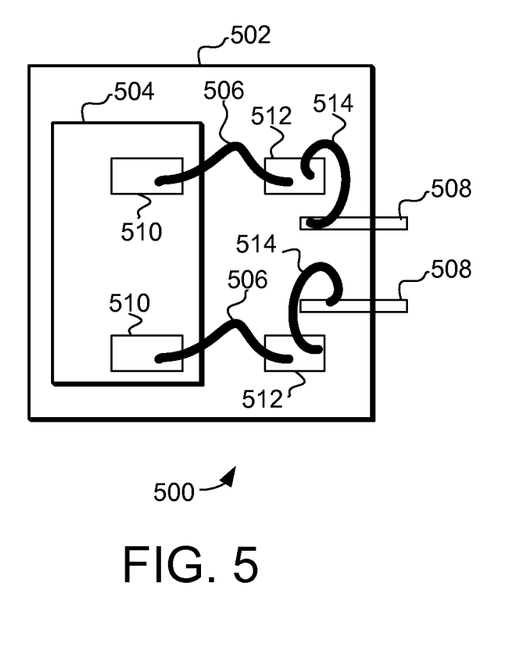
FIG. 5 is a schematic diagram of a packaged semiconductor device in accordance with an example embodiment.

FIG. 5 illustrates a packaged semiconductor device 500. In this simplified example, the packaged semiconductor device 500 includes a package 502, a die 504 that includes a dual-path device (not illustrated in FIG. 5), two bonding wires 506, and two leads 508. In general the package 502 encases the die 504 and supports the two leads 508. The bonding wires 506 are coupled between two pads 510 on the semiconductor die 504 and a second set of pads 512. In accordance with the embodiments described herein, compensation networks 514 are coupled between the second set of pads 512 and the leads 508. As such, the compensation networks 514 are in series with the bonding wires 506. Die 504 may include two or more transistors associated with two or more amplifiers or amplification paths. Alternatively, packaged semiconductor device 500 may include multiple die that serve the function of die 504 (e.g., one or more die for each amplifier or amplification path). Further, although only a single set of leads 508 are shown in FIG. 5 on one side of the package 502 (e.g., corresponding to a pair of output leads or input leads), package 502 also includes one or more additional leads on the other side of the package 502 (e.g., corresponding to input leads or output leads).

A first mutual inductance exists between the bonding wires 506. The compensation networks 514 are configured such that a second mutual inductance exists between the compensation networks 514, and that second mutual inductance at least partially cancels the effects of the first mutual inductance. Specifically, to provide a "negative" mutual inductance that provides partial cancellation the compensation networks 514 are configured to have opposite relative coiling directions compared to the bonding wires 506. This partial cancellation of the effects of the mutual inductance between bonding wires 506 can improve the performance of the dual-path device on the die 504. For example, this cancellation can improve the performance of the dual-path amplifiers by reducing the load impedance variation that can otherwise be caused by mutual inductance between bonding wires 506.

Figure 6:
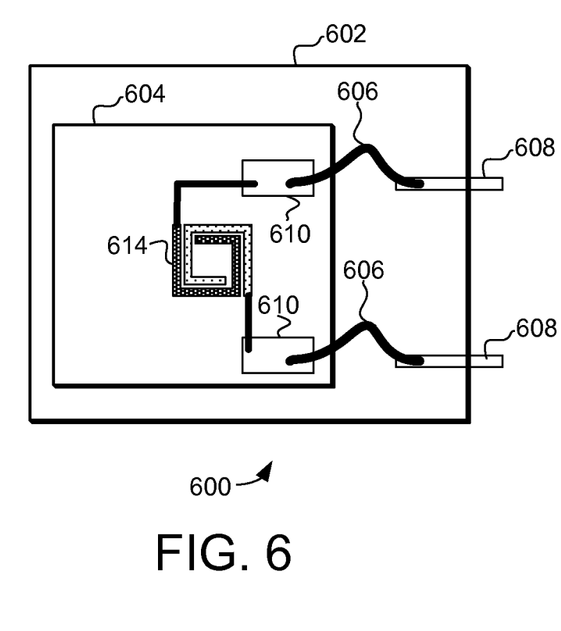
FIG. 6 is a schematic diagram of a packaged semiconductor device in accordance with an example embodiment.

FIG. 6 illustrates a packaged semiconductor device 600. In this simplified example, the packaged semiconductor device 600 includes a package 602, a die 604, two bonding wires 606, and two leads 608. The bonding wires 606 are coupled to two pads 610 on the semiconductor die 604 and the leads 608. In accordance with the embodiments described herein, compensation networks 614 are coupled between the two pads 610 and a dual-path device (not illustrated in FIG. 6) on the die 604. These compensation networks 614 are in series with the bonding wires 606. Die 604 may include two or more transistors associated with two or more amplifiers or amplification paths. Alternatively, packaged semiconductor device 600 may include multiple die that serve the function of die 604 (e.g., one or more die for each amplifier or amplification path). Further, although only a single set of leads 608 are shown in FIG. 6 on one side of the package 602 (e.g., corresponding to a pair of output leads or input leads), package 602 also includes one or more additional leads on the other side of the package 602 (e.g., corresponding to input leads or output leads).

A first mutual inductance exists between the bonding wires 606. The compensation networks 614 are configured such that a second mutual inductance exists between the compensation networks 614, which at least partially cancels the effects of the first mutual inductance. In this case, the compensation networks 614 are formed with integrated passive inductors formed on the die 604. In an alternate embodiment, the integrated passive inductors may be formed on one or more separate die from die 604. These integrated passive inductors are interleaved to have a second mutual inductance. Furthermore, the direction of the interleaving is such that mutual inductance is negative compared to the mutual inductance between bonding wires 606, and thus provides at least a partial cancellation of the mutual inductance of the bonding wires 606. As described above, this partial cancellation of the effects of the mutual inductance between bonding wires 606 can improve the performance of the dual-path device on the die 604. For example, this cancellation can improve the performance of the dual-path amplifiers by reducing the gain variations that can otherwise be caused by mutual inductance between bonding wires 606. The embodiments described herein can provide improved device performance in a variety of dual-path integrated devices.

In one embodiment an apparatus is provided, comprising: a multi-path integrated device, the multi-path integrated device having a first output and a second output, where the first output is configured to be coupled to a first output lead through a first bonding wire and where the second output is configured to be coupled to a second output lead through a second bonding wire, and where the second bonding wire has a first mutual inductance with the first bonding wire; and a first compensation network coupled to the first output and a second compensation network coupled to the second output, the second compensation network configured to have a second mutual inductance with the first compensation network, the second mutual inductance configured to at least partially cancel effects of the first mutual inductance.

In another embodiment a packaged integrated circuit device is provided, comprising: one or more semiconductor die including a multi-path amplifier, the multi-path amplifier including a first output and a second output; a package encasing the semiconductor die, the package including a first output lead and a second output lead, the first output lead coupled to the first output through a first bonding wire and the second output lead coupled to the second output through a second bonding wire, where the second bonding wire has a first mutual inductance with the first bonding wire; and a first compensation network coupled to the first output and a second compensation network coupled to the second output, the second compensation network configured to have a second mutual inductance with the first compensation network, the second mutual inductance configured to at least partially cancel effects of the first mutual inductance.

In another embodiment a method is provided, comprising: providing a semiconductor die including a multi-path device, the multi-path device including a first output and a second output; coupling a first output lead to the first output through a first bonding wire; coupling a second output lead to the second output through a second bonding wire, where the second bonding wire has a first mutual inductance with the first bonding wire; coupling a first compensation network to the first output; and coupling a second compensation network to the second output, the second compensation network configured to have a second mutual inductance with the first compensation network, the second mutual inductance configured to at least partially cancel effects of the first mutual inductance.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An apparatus comprising:
a first output lead;
a second output lead;
a multi-path device, the multi-path device having a first amplifier with a first output, and a second amplifier with a second output;
a first set of multiple parallel bonding wires coupling the first output of the first amplifier with the first output lead;
a second set of multiple parallel bonding wires coupling the second output of the second amplifier with the second output lead, wherein the second set of bonding wires has a first mutual inductance with the first set of bonding wires;

a first compensation network coupled in series with the first set of multiple parallel bonding wires between the first output and the first output lead; and a second compensation network coupled in series with the second set of multiple parallel bonding wires between the second output and the second output lead, the second compensation network configured to have a second mutual inductance with the first compensation network, the second mutual inductance configured to at least partially cancel effects of the first mutual inductance.

2. The apparatus of claim 1 wherein the first compensation network is coupled between the first bonding wire and the first output lead and wherein the second compensation network is coupled between the second bonding wire and the second output lead.

3. The apparatus of claim 2 wherein the first compensation network and the second compensation network comprise proximate conductors that provide the second mutual inductance in the form of a negative mutual inductance compared to the first mutual inductance between the first bonding wire and the second bonding wire.

4. An apparatus comprising:
a multi-path integrated device, the multi-path integrated device having a first output and a second output, where the first output is configured to be coupled to a first output lead through a first bonding wire and where the second output is configured to be coupled to a second output lead through a second bonding wire, and where the second bonding wire has a first mutual inductance with the first bonding wire; and
a first compensation network coupled to the first output and a second compensation network coupled to the second output, the second compensation network configured to have a second mutual inductance with the first compensation network, the second mutual inductance configured to at least partially cancel effects of the first mutual inductance, wherein the first compensation network and the second compensation network comprise bonding wires having a relative coiling direction opposite the first bonding wire and the second bonding wire.

5. An apparatus comprising:
a multi-path integrated device, the multi-path integrated device having a first output and a second output, where the first output is configured to be coupled to a first output lead through a first bonding wire and where the second output is configured to be coupled to a second output lead through a second bonding wire, and where the second bonding wire has a first mutual inductance with the first bonding wire; and
a first compensation network coupled to the first output and a second compensation network coupled to the second output, the second compensation network configured to have a second mutual inductance with the first compensation network, the second mutual inductance configured to at least partially cancel effects of the first mutual inductance, wherein the first compensation network and the second compensation network comprise interleaved integrated passive inductors.

6. An apparatus comprising:
a multi-path integrated device, the multi-path integrated device having a first output and a second output, where the first output is configured to be coupled to a first output lead through a first bonding wire and where the second output is configured to be coupled to a second output lead through a second bonding wire, and where the second bonding wire has a first mutual inductance with the first bonding wire; and
a first compensation network coupled to the first output and a second compensation network coupled to the second output, the second compensation network configured to have a second mutual inductance with the first compensation network, the second mutual inductance configured to at least partially cancel effects of the first mutual inductance, wherein the first compensation network is coupled between the multi-path integrated device and the first bonding wire and wherein the second compensation network is coupled between the multi-path integrated device and the second bonding wire.

7. The apparatus of claim 6 wherein the first compensation network and the second compensation network comprise integrated passive inductors.

8. The apparatus of claim 7 wherein the integrated passive inductors are interleaved to provide the second mutual inductance in the form of a negative mutual inductance compared to the first mutual inductance between the first bonding wire and the second bonding wire.

9. An apparatus comprising:
a multi-path integrated device, the multi-path integrated device having a first output and a second output, where the first output is configured to be coupled to a first output lead through a first bonding wire and where the second output is configured to be coupled to a second output lead through a second bonding wire, and where the second bonding wire has a first mutual inductance with the first bonding wire; and
a first compensation network coupled to the first output and a second compensation network coupled to the second output, the second compensation network configured to have a second mutual inductance with the first compensation network, the second mutual inductance configured to at least partially cancel effects of the first mutual inductance, wherein the multi-path integrated device comprises a first amplifier and a second amplifier, the first amplifier coupled to the first output and the second amplifier coupled to the second output.

10. The apparatus of claim 9 wherein the first amplifier is a main amplifier of a Doherty amplifier, and the second amplifier is a peaking amplifier of the Doherty amplifier.

11. An apparatus comprising:
a multi-path integrated device, the multi-path integrated device having a first output and a second output, where the first output is configured to be coupled to a first output lead through a first bonding wire and where the second output is configured to be coupled to a second output lead through a second bonding wire, and where the second bonding wire has a first mutual inductance with the first bonding wire; and
a first compensation network coupled to the first output and a second compensation network coupled to the second output, the second compensation network configured to have a second mutual inductance with the first compensation network, the second mutual inductance configured to at least partially cancel effects of the first mutual inductance, wherein the multi-path integrated device additionally comprises a first input and a second input, where the first input is configured to be coupled to a first input lead through a third bonding wire and where the second input is configured to be coupled to a second input lead through a fourth bonding wire, and where the third bonding wire has a third mutual inductance with the fourth bonding wire, and wherein the apparatus further comprises:

a third compensation network coupled to the first input and a fourth compensation network coupled to the second input, the fourth compensation network configured to have a fourth mutual inductance with the third compensation network, the fourth mutual inductance configured to at least partially cancel effects of the third mutual inductance.

12. A packaged integrated circuit device comprising:

one or more semiconductor die including a multi-path amplifier, the multi-path amplifier including a first output and a second output;

a package encasing the semiconductor die, the package including a first output lead and a second output lead, the first output lead coupled to the first output through a first bonding wire and the second output lead coupled to the second output through a second bonding wire, where the second bonding wire has a first mutual inductance with the first bonding wire; and a first compensation network coupled to the first output and a second compensation network coupled to the second output, the second compensation network configured to have a second mutual inductance with the first compensation network, the second mutual inductance configured to at least partially cancel effects of the first mutual inductance.

13. The packaged integrated circuit device of claim 12 wherein the first compensation network is coupled between the first bonding wire and the first output lead and wherein the second compensation network is coupled between the second bonding wire and the second output lead.

14. The packaged integrated circuit device of claim 12 wherein the first compensation network is coupled between the multi-path amplifier and the first bonding wire and wherein the second compensation network is coupled between the multi-path amplifier and the second bonding wire.

15. The packaged integrated circuit device of claim 14 wherein the first compensation network and the second compensation network comprise interleaved integrated passive inductors.

16. The packaged integrated circuit device of claim 12 wherein the multi-path amplifier additionally comprises a first input and a second input, and wherein the package further includes a first input lead and a second input lead, the first input lead coupled to the first input through a third bonding wire and the second input lead coupled to the second input through a fourth bonding wire, and where the third bonding wire has a third mutual inductance with the fourth bonding wire, and wherein the packaged integrated circuit device further comprises:

a third compensation network coupled to the first input and a fourth compensation network coupled to the second input, the fourth compensation network configured to have a fourth mutual inductance with the third compensation network, the fourth mutual inductance configured to at least partially cancel effects of the third mutual inductance.

17. A method comprising:

providing a semiconductor die including a multi-path device, the multi-path device including a first output and a second output;

coupling a first output lead to the first output through a first bonding wire;

coupling a second output lead to the second output through a second bonding wire, where the second bonding wire has a first mutual inductance with the first bonding wire;

coupling a first compensation network to the first output; and coupling a second compensation network to the second output, the second compensation network configured to have a second mutual inductance with the first compensation network, the second mutual inductance configured to at least partially cancel effects of the first mutual inductance.

18. The method of claim 17 wherein the first compensation network is coupled between the first bonding wire and the first output lead and wherein the second compensation network is coupled between the second bonding wire and the second output lead.

19. The method of claim 17 wherein the first compensation network is coupled between the multi-path device and the first bonding wire and wherein the second compensation network is coupled between the multi-path device and the second bonding wire.

20. The method of claim 17 wherein the multi-path device additionally comprises a first input and a second input, and further comprising:

coupling the first input to a first input lead through a third bonding wire;

coupling the second input to a second input lead through a fourth bonding wire, where the third bonding wire has a third mutual inductance with the fourth bonding wire;

coupling a third compensation network to the first input; and coupling a fourth compensation network to the second input, the fourth compensation network configured to have a fourth mutual inductance with the third compensation network, the fourth mutual inductance configured to at least partially cancel effects of the third mutual inductance.

* * * * *